United States Patent
Ota et al.

(10) Patent No.: US 9,146,481 B2
(45) Date of Patent: Sep. 29, 2015

(54) LOCAL EXPOSURE APPARATUS, LOCAL EXPOSURE METHOD AND STORAGE MEDIUM

(75) Inventors: Yoshiharu Ota, Koshi (JP); Shigeru Moriyama, Koshi (JP); Yuki Matsumura, Koshi (JP); Shigeki Tanaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 801 days.

(21) Appl. No.: 13/171,972

(22) Filed: Jun. 29, 2011

(65) Prior Publication Data

US 2012/0002183 A1    Jan. 5, 2012

(30) Foreign Application Priority Data

Jun. 30, 2010   (JP) ................................. 2010-148484

(51) Int. Cl.
   *G03B 27/42*   (2006.01)
   *G03F 7/20*    (2006.01)
   *H01L 27/12*   (2006.01)

(52) U.S. Cl.
   CPC ........ *G03F 7/70791* (2013.01); *G03F 7/70291* (2013.01); *H01L 27/1288* (2013.01)

(58) Field of Classification Search
   CPC ......................... G03F 7/70291; G03F 7/70791
   USPC ..................................................... 355/67, 27
   See application file for complete search history.

(56) References Cited

U.S. PATENT DOCUMENTS

| 5,840,451 | A  | * | 11/1998 | Moore et al. | 430/30 |
| 6,603,530 | B1 | * | 8/2003  | Kohno        | 355/53 |
| 8,691,481 | B2 | * | 4/2014  | Ikeda et al. | 430/30 |
| 2003/0091277 | A1 | * | 5/2003 | Mei | 385/33 |
| 2004/0124372 | A1 | * | 7/2004 | Gil et al. | 250/492.2 |
| 2006/0001852 | A1 | * | 1/2006 | Lee et al. | 355/53 |
| 2007/0296936 | A1 | * | 12/2007 | Kato et al. | 355/52 |
| 2008/0204685 | A1 | * | 8/2008 | Kono et al. | 355/53 |
| 2009/0296063 | A1 | * | 12/2009 | Opower | 355/67 |
| 2010/0195078 | A1 | * | 8/2010 | Horiuchi et al. | 355/71 |

FOREIGN PATENT DOCUMENTS

| JP | 2007-158253 A  | 6/2007 |
| JP | 2009-109550 A  | 5/2009 |
| WO | 2010/032224 A2 | 3/2010 |

* cited by examiner

*Primary Examiner* — Deoram Persaud
(74) *Attorney, Agent, or Firm* — Nath, Goldberg & Meyer; Jerald L. Meyer

(57) ABSTRACT

A local exposure apparatus for performing exposure processing on a specific area of a photosensitive film formed on a substrate includes a substrate conveyor configured to define a substrate conveying path and to horizontally convey the substrate along the substrate conveying path, a chamber configured to define an exposure processing space, a light source including a plurality of light-emitting elements linearly arranged above the substrate conveying path, a light emission drive unit configured to selectively drive one or more of the light-emitting elements of the light source, a substrate detector configured to detect the substrate conveyed by the substrate conveyor, and a control unit configured to control the light emission drive unit such that, when the specific area of the photosensitive film moves below the light source, only the light-emitting elements capable of irradiating the given area are driven to emit the light.

20 Claims, 19 Drawing Sheets

FIG. 6

| COORDINATES | FILM THICKNESS REDUCTION | REQUIRED ILLUMINANCE | LIGHT-EMITTING ELEMENTS | FORWARD CURRENT VALUE |
|---|---|---|---|---|
| (x1, y1) | 1000 Å | 0.2mJ/cm$^2$ | Ln-3 | 7.5mA |
| (x2, y1) | 500 Å | 0.1mJ/cm$^2$ | Ln-3 | 4.1mA |
| (x3, y1) | 500 Å | 0.1mJ/cm$^2$ | Ln-3 | 4.1mA |
| ⋮ | ⋮ | ⋮ | ⋮ | ⋮ |
| ⋮ | ⋮ | ⋮ | ⋮ | ⋮ |
| ⋮ | ⋮ | ⋮ | ⋮ | ⋮ |

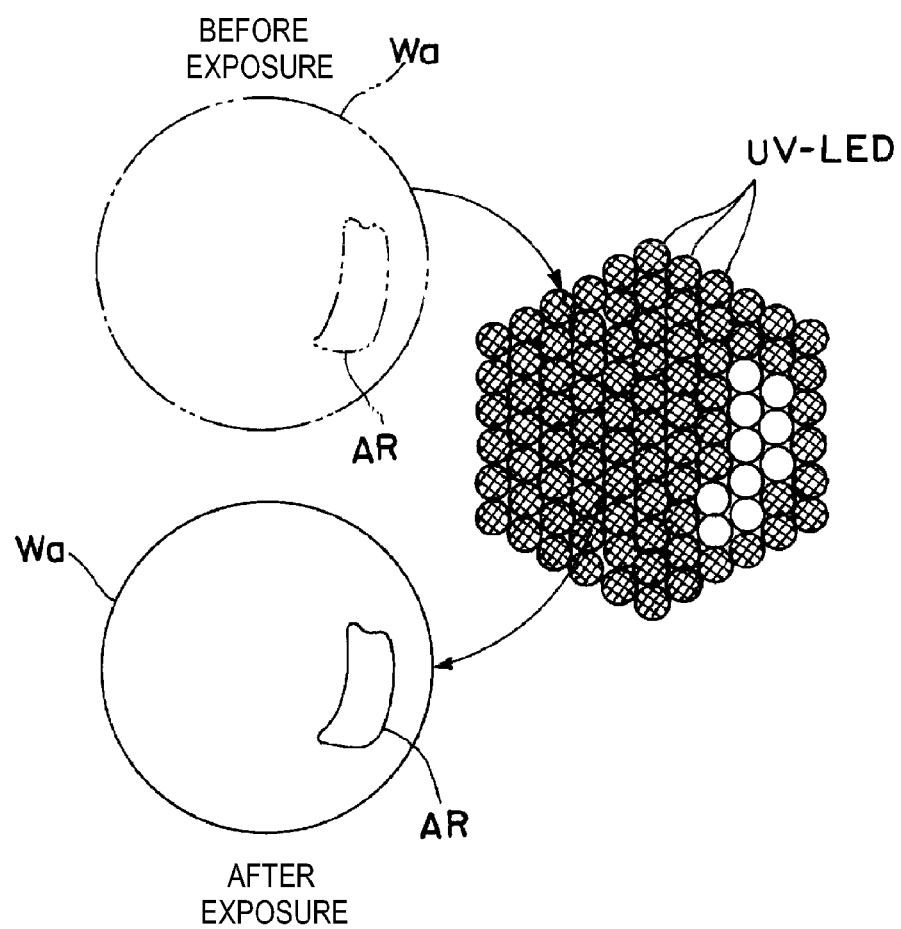

ced to etching (see FIG. 20B) and the resist pattern R as
LOCAL EXPOSURE APPARATUS, LOCAL EXPOSURE METHOD AND STORAGE MEDIUM

CROSS-REFERENCE TO RELATED APPLICATIONS

This application is based upon and claims the benefit of priority from Japanese Patent Applications No. 2010-148484, filed on Jun. 30, 2010, the entire contents of which are incorporated herein by reference.

TECHNICAL FIELD

The present disclosure relates to a local exposure apparatus and method for performing local exposure on a target substrate with a photosensitive film and a storage medium for storing a program for execution of the local exposure method.

BACKGROUND

In the manufacture of, e.g., an FPD (Flat Panel Display), a circuit pattern is formed through a so-called photolithography process. In this photolithography process, as disclosed in JP2007-158253A, a specified film is formed on a target substrate such as a glass substrate and, subsequently, photoresist (hereinafter referred to as "resist") is applied to form a resist film (or a photosensitive film). Then, the resist film is exposed in conformity with a circuit pattern and is developed to form the circuit pattern.

In the photolithography process, as shown in FIG. 19A, a resist pattern R may be made to have different thickness portions (namely, thick portions R1 and a thin portion R2, for example, having nearly half the thickness of the thick portions R1) and then may be subjected to etching more than once. This makes it possible to reduce the number of photomasks and the number of processing steps. Typically, the resist pattern R of this type can be obtained by half (halftone) exposure processing that makes use of a single halftone mask having different light transmittance portions.

A circuit pattern forming process using the resist pattern R applied with the half exposure processing will be described in detail with reference to FIGS. 19A through 19E. Referring to FIG. 19A, a gate electrode 200, an insulating layer 201, a Si layer 202 composed of an a-Si layer (undoped amorphous Si layer) 202a and an n+a-Si layer (phosphor-doped amorphous Si layer) 202b, and a metal layer 203 for formation of electrodes are sequentially arranged on a glass substrate G. A resist pattern R obtained by the half exposure processing and the development processing is formed on the metal layer 203.

After forming the resist pattern R (having the thick portions R1 and the thin portion R2), the metal layer 203 is subjected to etching (first etching), as shown in FIG. 19B, at which time the resist pattern R is used as a mask. Then, the resist pattern R as a whole is subjected to ashing under the presence of plasma. This produces resist patterns R3 having a nearly halved thickness, as shown in FIG. 19C (for example, the thicknesses of the thick portions R1 are nearly halved while the thin portion R2 may be removed to expose an underling portion of the metal layer 203). Subsequently, as shown in FIG. 19D, the exposed portion of the metal layer 203 and the exposed portion of the Si layer 202 are subjected to etching (second etching), at which time the resist patterns R3 are used as masks. Finally, as shown in FIG. 19E, a circuit pattern is obtained by removing the resist patterns R3.

In the half exposure processing using the resist pattern R having the thick portions R1 and the thin portion R2, however, the thickness of the resist pattern R may become uneven through the substrate plane during formation of the resist pattern R. This poses a problem in that the line width of the resultant patterns and the pitch between the resultant patterns become irregular.

In this regard, description will be made in more detail with reference to FIGS. 20A through 20E. FIG. 20A shows an instance where the resist pattern R is formed such that the thickness t2 of the thin portion R2 of the resist pattern R becomes greater than the thickness t1 of the thin portion R2 shown in FIG. 19A. In this instance, just like the process shown in FIGS. 19A through 19E, the metal layer 203 is subjected to etching (see FIG. 20B) and the resist pattern R as a whole is subjected to ashing (see FIG. 20C).

This produces resist patterns R3 having a nearly halved thickness as shown in FIG. 20C. Assuming that the thickness of the resist film removed is equal to that shown in FIG. 19C, the pitch p2 between the resist patterns R3 may become smaller than the pitch p1 shown in FIG. 19C. In this state, the metal layer 203 and the Si layer 202 are subjected to etching (see FIG. 20D) and the resist patterns R3 are removed (see FIG. 20E). Consequently, the pitch p2 of the circuit pattern thus produced becomes smaller than the pitch p1 shown in FIG. 19E (in other word, the line width of the circuit pattern becomes greater).

SUMMARY

To address the problems of the related art as described above, the present disclosure provides some embodiments of a local exposure apparatus and method, which is capable of enhancing the in-plane thickness uniformity of a residual resist film left after development processing and capable of reducing the irregularity in line width and pitch of a wiring pattern, and a storage medium for storing a program for execution of the local exposure method.

According to one embodiment of the present disclosure, there is provided a local exposure apparatus for performing exposure processing on a specific area of a photosensitive film formed on a substrate, the apparatus including: a substrate conveying unit configured to form a substrate conveying path and to horizontally convey the substrate along the substrate conveying path at a specified substrate conveying speed; a chamber configured to surround a part of the substrate conveying path and to form an exposure processing space in which the substrate is subjected to the exposure processing; a light source including a plurality of light-emitting elements linearly arranged in a direction intersecting a substrate conveying direction above the substrate conveying path within the chamber, the light source being capable of illuminating the photosensitive film on the substrate conveyed below the light source with lights emitted from the plurality of light-emitting elements; a light emission drive unit configured to selectively drive one or more of the plurality of light-emitting elements of the light source as a single light emission control unit; a substrate detecting unit arranged at an upstream side of the light source in the substrate conveying path and configured to detect the substrate conveyed by the substrate conveying unit; and a control unit configured to receive a substrate detection signal from the substrate detecting unit and to control the light emission drive unit to drive the plurality of light-emitting elements, wherein the control unit is configured to find a conveying position of the substrate based on the substrate detection signal from the substrate detecting unit and the substrate conveying speed and control the light emission drive unit such that, when the specific area of the photosensitive film formed on the substrate moves below the light source, one or more of the plurality of light-emitting elements capable of illuminating the specific area are driven to emit the lights.

According to another embodiment of the present disclosure, there is provided a local exposure apparatus for performing exposure processing on a specific area of a photosensitive film formed on a substrate, the apparatus including: a chamber configured to accommodate the substrate and to form an exposure processing space in which the substrate is subjected to the exposure processing; a substrate holding unit configured to hold the substrate within the chamber; a light source including a plurality of light-emitting elements linearly arranged above the substrate holding unit within the chamber, the light source being capable of illuminating the photosensitive film on the substrate held by the substrate holding unit with lights emitted from the plurality of light-emitting elements; a light emission drive unit configured to selectively drive one or more of the plurality of light-emitting elements of the light source as a single light emission control unit; a moving unit configured to parallel-move the plurality of light-emitting elements and the substrate relative to each other; and a control unit configured to control the light emission drive unit to drive the plurality of light-emitting elements, wherein the control unit is configured to control the light emission drive unit such that, when the specific area of the photosensitive film formed on the substrate moves below the light source, one or more of the plurality of light-emitting elements capable of illuminating the specific area are driven to emit the lights.

According to still another embodiment of the present disclosure, there is provided a local exposure method for locally exposing a specific area of a photosensitive film formed on a substrate conveyed along a substrate conveying path by selectively controlling a plurality of light-emitting elements to emit lights within a chamber configured to cover a part of the substrate conveying path and to form an exposure processing space for the substrate, the plurality of light-emitting elements being linearly arranged in a direction intersecting a conveying direction of the substrate above the substrate conveying path, the method including: horizontally conveying the substrate along the substrate conveying path; detecting the substrate conveyed along the substrate conveying path; and, when the specific area of the photosensitive film formed on the substrate moves below the plurality of light-emitting elements, controlling one or more of the plurality of light-emitting elements capable of illuminating the specific area to emit the lights.

According to a still further embodiment of the present disclosure, there is provided a local exposure method for locally exposing a specific area of a photosensitive film formed on a substrate by selectively controlling a plurality of light-emitting elements to emit lights on a target surface of the substrate within a chamber forming an exposure processing space for the substrate, the method comprising: holding the substrate within the chamber; and controlling one or more of the plurality of light-emitting elements capable of illuminating the specific area to emit the lights while parallel-moving the light-emitting elements and the held substrate relative to each other.

According to still another embodiment of the present disclosure, there is provided a storage medium storing a program for locally exposing a specific area of a photosensitive film formed on a substrate by controlling at least a part of a plurality of light-emitting elements to emit lights, the program sequentially performing preparing in advance data needed to correct individual illuminance variations of the light-emitting elements; positioning the substrate in an exposure processing space; and, based on the data, controlling one or more of the plurality of light-emitting elements capable of illuminating the specific area to emit the lights while parallel-moving the substrate positioned in the exposure processing space and the light-emitting elements relatively to each other.

According to still another embodiment of the present disclosure, there is provided a local exposure method for locally exposing a specific area of a resist film formed on a substrate conveyed along a substrate conveying path by selectively controlling a plurality of light-emitting elements to emit lights within a chamber configured to cover a part of the substrate conveying path and to form an exposure processing space for the substrate, the plurality of light-emitting elements being linearly arranged in a direction intersecting a substrate conveying direction above the substrate conveying path, the method including: coating a resist on a surface of the substrate; drying the resist coated on the substrate; exposing the substrate coated with the resist through a photomask corresponding to a circuit pattern by an exposure dose smaller than a exposure dose required to form the circuit pattern; selectively controlling the plurality of light-emitting elements to emit the lights to expose the substrate coated with the resist; and developing the exposed substrate.

BRIEF DESCRIPTION OF THE DRAWINGS

FIG. 6 is a table showing different configuration parameters of a light emission control program employed in the present local exposure apparatus.

FIG. 18 is a plan view for explaining a local exposure apparatus according to a fourth embodiment of the present disclosure.

DETAILED DESCRIPTION

Figure 1:
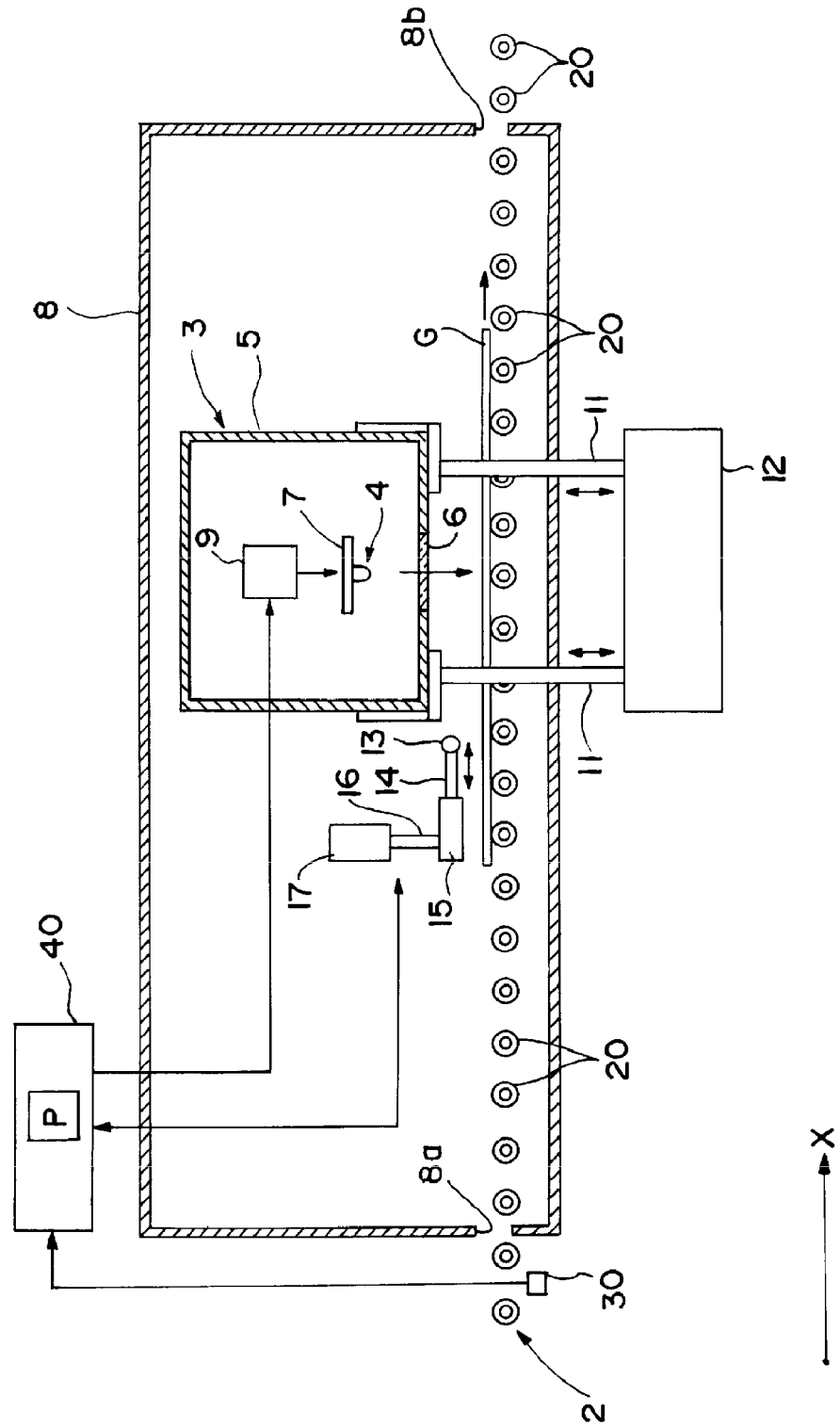
FIG. 1 is a section view showing the overall configuration of a local exposure apparatus according to a first embodiment of the present disclosure.
Figure 2:
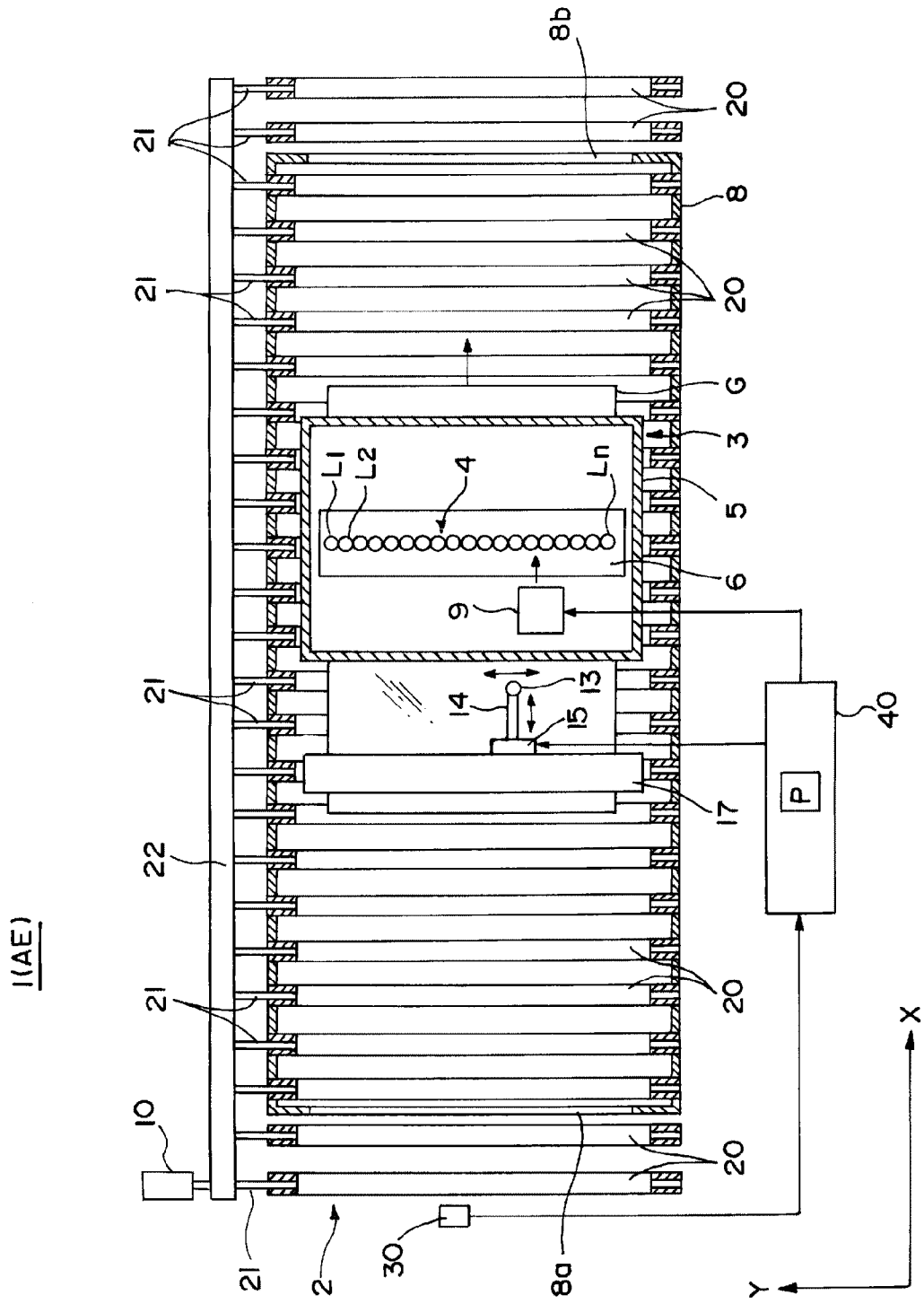
FIG. 2 is a plan view showing the overall configuration of the local exposure apparatus.

Certain embodiments of a local exposure apparatus and method according to the present disclosure will now be described in detail with reference to the drawings. FIG. 1 is a section view showing the overall configuration of a local exposure apparatus 1 according to a first embodiment of the present disclosure. FIG. 2 is a plan view showing the overall configuration of the local exposure apparatus. FIGS. 3A through 3E are block diagrams schematically showing different arrangement examples of the present local exposure apparatus 1 (AE) in a photolithography process.

The local exposure apparatus 1 (AE) shown in FIGS. 1 and 2 is arranged in units for performing a series of photolithography steps while horizontally conveying a target substrate in an X-direction (which will be referred to as "horizontal conveying") as respectively illustrated in FIGS. 3A through 3E. More specifically, a resist coating apparatus 51 (CT) for coating a resist solution on a target substrate G to form a photosensitive film and a reduced-pressure drying apparatus 52 (DP) for drying a resist film (or the photosensitive film) formed on the substrate G within a depressurized chamber are arranged in order to perform a photolithography process. Moreover, a pre-bake apparatus 53 (PRB) for conducting heat treatment to fix the resist film to the substrate G, a cooling apparatus 54 (COL) for cooling the substrate G and the resist film to a predetermined temperature, an exposure apparatus 55 (EXP) for exposing the resist film in a specified circuit pattern and a developing apparatus 56 (DEP) for developing the exposed resist film are arranged in the named order.

Figure 3A:
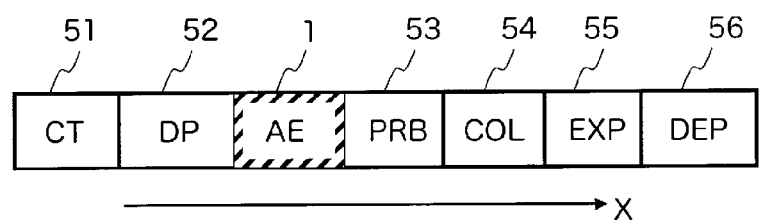
FIGS. 3A through 3E are block diagrams schematically showing different arrangement examples of the present local exposure apparatus arranged in units composed of a series of apparatuses involving a photolithography process.
Figure 3B:
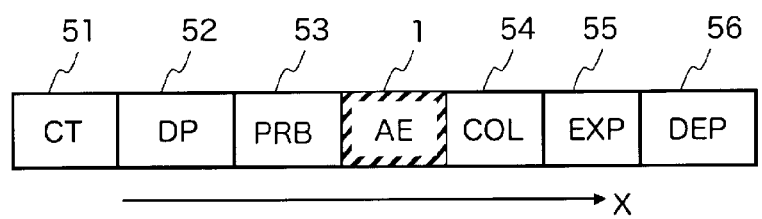
Figure 3C:
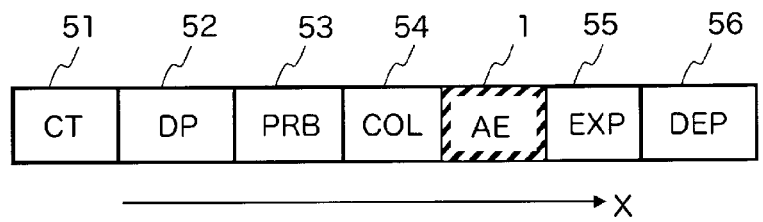
Figure 3D:
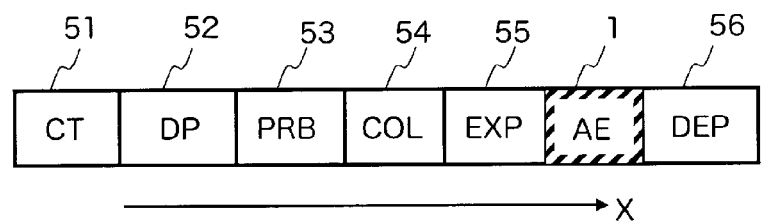
Figure 3E:
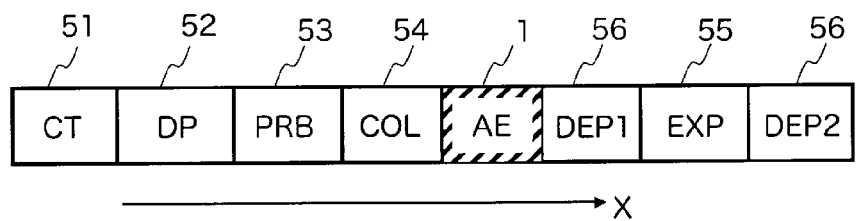

The local exposure apparatus 1 (AE) of the present disclosure is arranged at any one position between the above-described apparatuses, as shown in FIGS. 3A through 3E. In other words, the local exposure apparatus 1 (AE) is arranged in a specified position behind the reduced-pressure drying apparatus 52 (DP) and before the developing apparatus 56 (DEP). In FIG. 3E, there is illustrated an instance where a first development processing (DEP 1) is performed after the exposure processing in the local exposure apparatus 1 (AE) but before the patterning exposure (EXP). The patterning exposure (EXP) and a second (final) development processing (DEP2) are performed after the uniformity of film thickness is increased by the first development processing (DEP 1). The first development processing (DEP 1) and the second (final) development processing (DEP2) may be performed either by the same developing apparatus 56 (DEP) or by different developing apparatuses provided independently of each other. When continuously processing a plurality of substrates G, the line width of the wiring patterns in a given area of each of the substrates G may become greater while the pitch between the wiring patterns in the give area may become smaller, when compared with the remaining areas. In this case, the local exposure apparatus 1 (AE) arranged as above may perform local exposure with respect to the given area (in order to reduce the film thickness).

The configuration of the local exposure apparatus 1 (AE) will now be described in detail. Referring to FIGS. 1 and 2, the local exposure apparatus 1 (AE) includes a substrate conveying path 2 along which the substrate G is conveyed in the X-direction by a plurality of rotatably-installed rollers 20. The substrate conveying path 2 includes a plurality of cylindrical columnar rollers 20 extending in the Y-direction (i.e., the direction perpendicular to the conveying direction of the substrate G) as shown in FIG. 2. The rollers 20 are rotatably installed with a specified interval left therebetween in the X-direction. The rollers 20 include rotation shafts 21 operatively connected to one another through a belt 22. One of the rotation shafts 21 is connected to a roller driving device 10, e.g., an electric motor.

The local exposure apparatus 1 (AE) further includes a box-shaped chamber 8 for surrounding a part of the substrate conveying path 2 and defining a space in which the substrate G is subjected to an exposure processing. As can be seen in FIG. 1, a slit-like entrance gate 8a extending in the Y-direction is provided in the front wall of the chamber 8. The substrate G placed on the substrate conveying path 2 is moved through the entrance gate 8a and is loaded into the chamber 8. A slit-like exit gate 8b extending in the Y-direction and allowing the substrate G on the substrate conveying path 2 to pass therethrough is provided in the rear wall of the chamber 8. Thus, the substrate G on the substrate conveying path 2 is moved through the exit gate 8b and is unloaded from the chamber 8.

As shown in FIG. 1, a light irradiator 3 for performing local exposure (UV light irradiation) with respect to the substrate G is arranged above the substrate conveying path 2 within the chamber 8. The light irradiator 3 includes a housing 5 for accommodating a light source 4 within a blocked space. A light irradiation window 6 formed of a light diffusing plate is provided on the bottom surface of the housing 5. In other words, the light irradiation window 6 is arranged between the light source 4 and the substrate G as an irradiation target.

The light source 4 accommodated within the housing 5 is a linear light source extending in the substrate width direction (or in the Y-direction). The linear light source 4 has a configuration in which UV-LED elements L1 through Ln (where n is a positive integer) for respectively emitting UV light having a specified wavelength (e.g., close to either a g-ray of 436 nm, an h-ray of 405 nm or an i-ray of 364 nm) are arranged on a circuit board 7 along a straight line. Since the light irradiated from the light source 4 is appropriately diffused by the light irradiation window 6, the lights of the adjoining UV-LED elements L are irradiated downwards forming a linearly continuous shape.

The light emitting operations of the UV-LED elements L making up the light source 4 may be independently controlled by a light emission drive unit 9 which can also control the respective forward current values supplied to the UV-LED elements L. In other words, the light irradiation illuminances of the UV-LED elements L varying depending on the electric currents supplied thereto can be changed by the control of the light emission drive unit 9. The operation of the light emission drive unit 9 is controlled by a control unit 40 including a computer.

As shown in FIG. 1, the light irradiator 3 is supported by lift shafts 11 from below. The lift shafts 11 are vertically movably installed through, e.g., ball screw mechanisms, so that they can be moved up and down by an up-down drive unit 12 including an electric motor. In other words, it is possible to change the height of the light irradiation position of the light irradiator 3 with respect to the substrate G conveyed along the substrate conveying path 2. The up-down drive unit 12 is controlled by the control unit 40.

An illuminance sensor 13 for detecting the illuminance (radiant flux) of the light irradiated from the light source 4 and having passed through the light irradiation window 6 is provided at one side (the upstream side of the conveying direction of the substrate G) of the light irradiator 3 within the chamber 8. The illuminance sensor 13 is arranged at the tip end of a forward-backward movement shaft 14 that can horizontally move forward and backward with respect to the position below the light irradiation window 6. The forward-backward movement shaft 14 is driven by a forward-backward drive unit 15 suspended from a support shaft 16. The support shaft 16 is installed so that it can be moved in the substrate width direction (i.e., in the Y-direction) by a horizontal movement drive unit 17. This enables the illuminance sensor 13 to detect the illuminance in an arbitrary position below the light irradiation window 6. The illuminance sensor 13 supplies a detection signal to the control unit 40 including the computer. The forward-backward drive unit 15 and the horizontal movement drive unit 17 are controlled by the control unit 40.

In this local exposure apparatus 1, a substrate detecting sensor 30 for detecting a specified portion (e.g., a tip end) of the substrate G being conveyed along the substrate conveying path 2 is provided, e.g., at the upstream side of the entrance gate 8a of the chamber 8. The substrate detecting sensor 30 is configured to output a detection signal to the control unit 40. Since the substrate G is conveyed along the substrate conveying path 2 at a predetermined speed (e.g., 50 mm/sec), the control unit 40 can find the conveying position of the substrate G based on the detection signal outputted from the substrate detecting sensor 30.

The control unit 40 holds a light emission control program P stored in a specified storage area. The light emission control program P is used to control the brightnesses of the UV-LED elements L of the light source 4, namely, the current values supplied to the UV-LED elements L, at a predetermined timing. In the light emission control program P, various configuration parameters used for execution of the program P may be set in advance. The configuration parameters include the illuminance of the light to be irradiated toward a specified position on the substrate G (namely, the current values to be supplied to the UV-LED elements L) and the information for specifying the UV-LED elements L to be controlled to illuminate the specified position on the substrate G.

Figure 4:
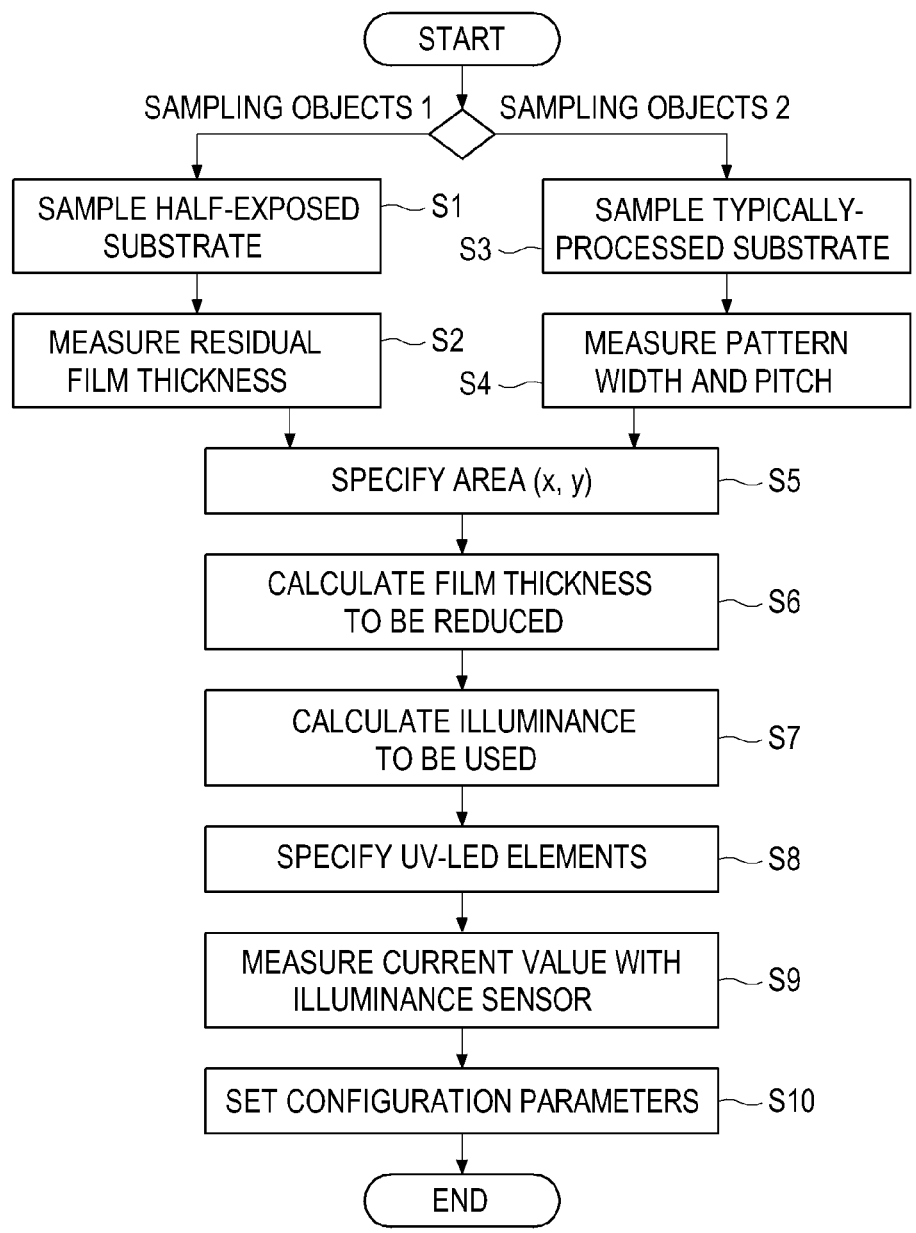
FIG. 4 is a flowchart illustrating a process for finding different configuration parameters of a light emission control program employed in the present local exposure apparatus.
Figure 5:
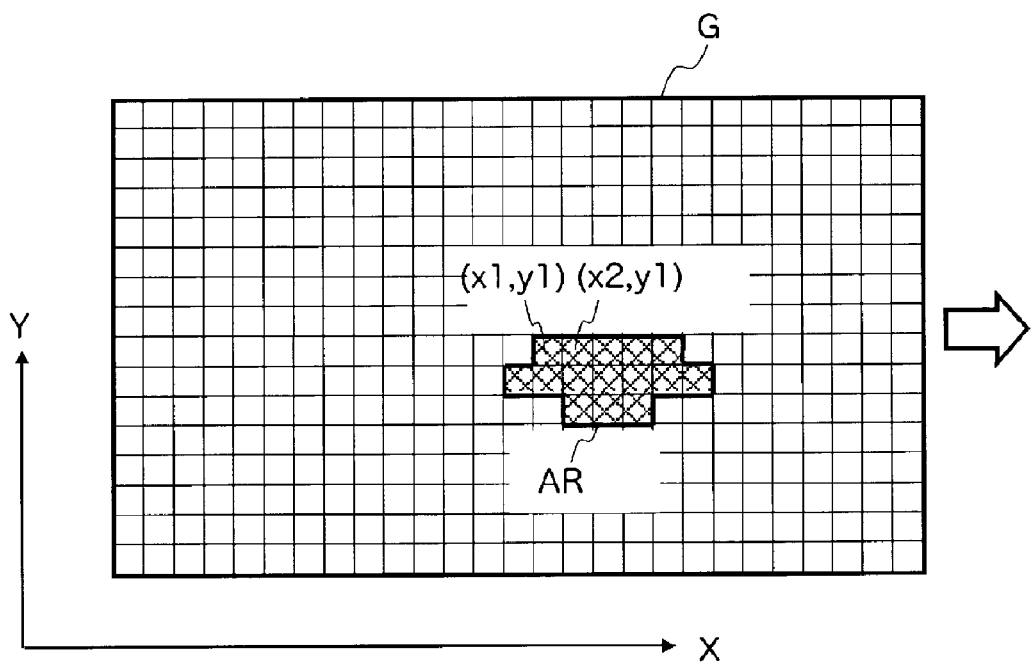
FIG. 5 is a plan view of a target substrate for explaining how to control the light emission of light-emitting elements in the present local exposure apparatus, in which view a local exposure position on the target substrate is designated by coordinates.

A step of finding the configuration parameters of the light emission control program P (a preparation step) will now be described with reference to FIGS. 4 through 6. In case of sampling objects 1, as shown in FIG. 4, a plurality of target substrates having passed through resist coating and then half exposure and development processing is first sampled (step S1 in FIG. 4). Then, the residual resist film thickness in the plane of each of the sampled substrates is measured (step S2 in FIG. 4). As schematically shown in FIG. 5, a certain area AR that needs to be subjected to film thickness reduction is specified by two-dimensional coordinate values (x, y) (step S5 in FIG. 4).

In case of sampling objects 2, as shown in FIG. 4, a plurality of target substrates each having a wiring pattern formed by a conventional photolithography process (without relying upon the local exposure apparatus 1) is sampled (step S3 in FIG. 4). Then, the line width of wiring patterns and the pitch between the wiring patterns in the plane of each of the sampled substrates are measured (step S4 in FIG. 4). As schematically shown in FIG. 5, a certain area AR that is necessary to be subjected to film thickness reduction is specified by two-dimensional coordinate values (x, y) (step S5 in FIG. 4).

If the certain area AR is specified, a film thickness reduction value in the certain area AR specified by the coordinate values (e.g., 1000 Å in case of the coordinate values (x1, y1)) is calculated (step S6 in FIG. 4). Based on the film thickness reduction value and other conditions such as the kind of resist, the illuminance of the light to be irradiated to achieve the film thickness reduction (e.g., 0.2 mJ/cm$^2$ in case of the coordinates (x1, y1)) is calculated as indicated by a table in FIG. 6 (step S7 in FIG. 4).

The UV-LED elements L capable of illuminating the respective coordinate values of the certain area AR are specified as indicated in a table in FIG. 6 (step S8 in FIG. 4). Forward current values to be supplied to enable the specified UV-LED elements L to emit lights at the desired illuminances are found (step S9 in FIG. 4). In order to find the forward currents, the light irradiator 3 is lifted to a specified height by the up-down drive unit 12. The illuminance sensor 13 is moved to below the light irradiation window 6 by the forward-backward drive unit 15 and the horizontal movement drive unit 17. In this regard, the distance between the light irradiation window 6 (e.g., a point on the light irradiation window 6 where the specified UV-LED elements L emit the lights) and the illuminance sensor 13 is adjusted to become equal to the distance between the light irradiation window 6 (e.g., the point on the light irradiation window 6 where the specified UV-LED elements L emit the lights) and the upper surface of the substrate G. The illuminance of the light emitted by each of the specified UV-LED elements L which are capable of illuminating the respective coordinate values the certain area AR is detected by the illuminance sensor 13. A current value supplied when the illuminance value detected by the illuminance sensor 13 becomes equal to the illuminance at which the corresponding one of the specified UV-LED elements L is required to emit light (i.e., the desired illuminance) is measured and used as one of the configuration parameters. If all the parameters are found and set though the flow illustrated in FIG. 4, the preparation step comes to an end (step St10 in FIG. 4).

Figure 7:
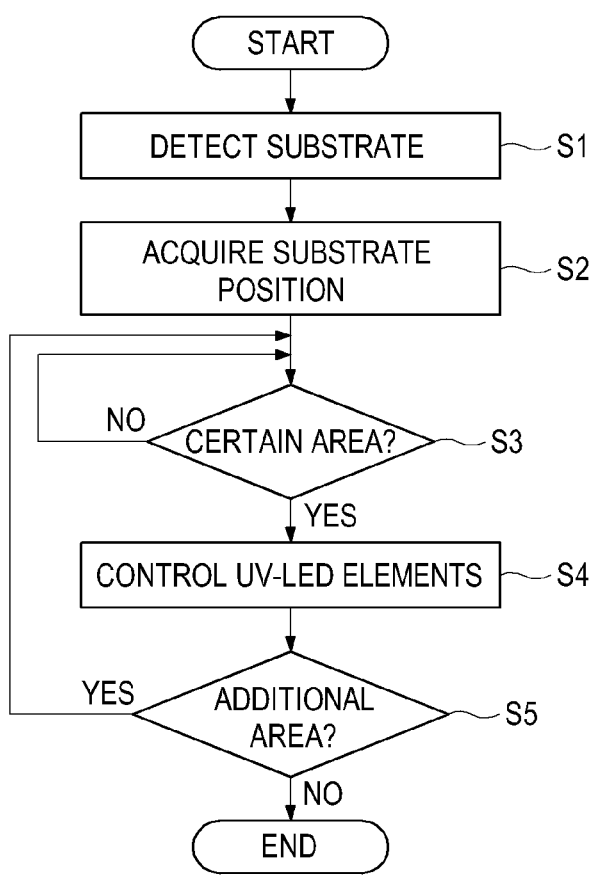
FIG. 7 is a flowchart illustrating a series of operations performed by the present local exposure apparatus.
Figure 8:
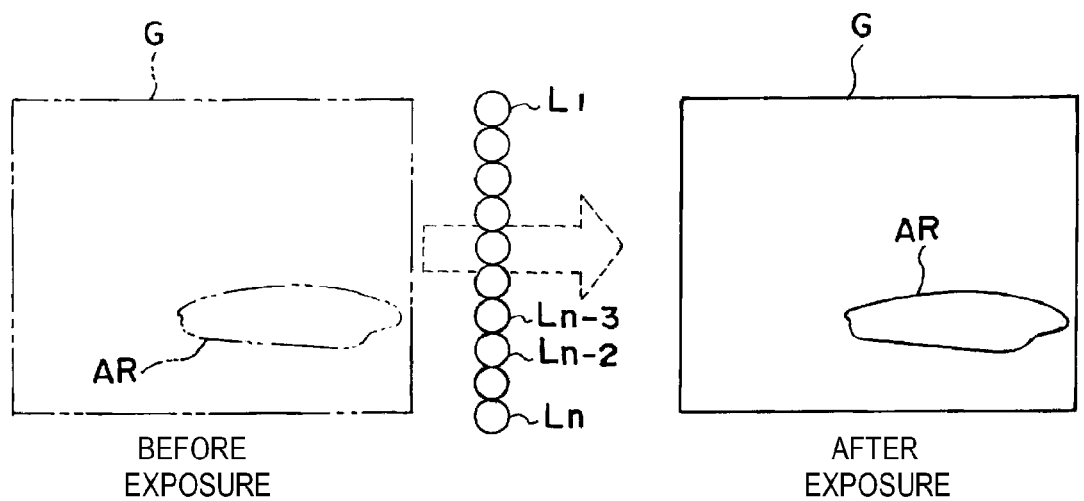
FIG. 8 is a plan view for explaining a local exposure operation performed by the present local exposure apparatus.
Figure 9:
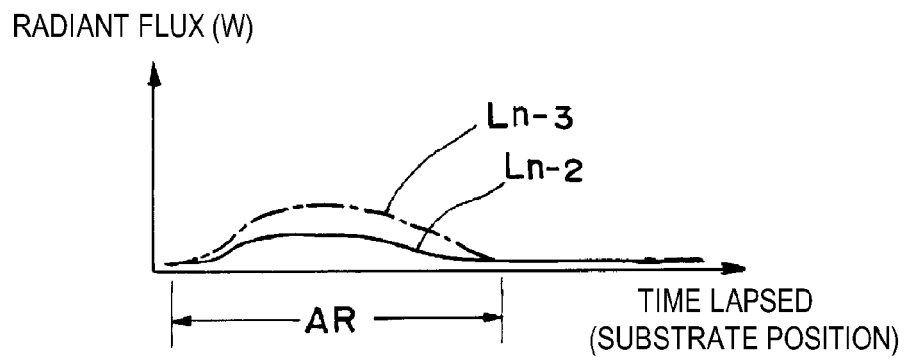
FIG. 9 is a graph for explaining the local exposure operation performed by the present local exposure apparatus.

A series of local exposure operations performed by the local exposure apparatus 1 will now be described with reference to FIGS. 7 through 9. After some preceding processes, the substrate G is conveyed along the substrate conveying path 2. Upon detecting the substrate G, the substrate detecting sensor 30 feeds a substrate detection signal to the control unit 40 (step S1 in FIG. 7). Based on the substrate detection signal and the substrate conveying speed, the control unit 40 begins to acquire (detect) the conveying position of the substrate G (step S2 in FIG. 7).

At the timing when the certain area of the substrate G required to be locally exposed passes below the light irradiator 3 (step S3 in FIG. 7), the control unit 40 controls the light emitting operations of the UV-LED elements L1 through Ln making up the light source 4 (step S4 in FIG. 7). In the event that light is irradiated on the certain area AR of the substrate G as schematically shown in FIG. 8, the light emitting operations of the UV-LED elements Ln-2 and Ln-3 arranged above the certain area AR are controlled by the control unit 40. More specifically, the forward currents are controlled such that, while the certain area AR of the substrate G moves below the light source 4, the radiant flux (W) is changed as illustrated by a graph in FIG. 9 (representing the magnitude of the radiant flux (W) of each of the UV-LED elements Ln-2 and Ln-3 with respect to the lapsed time). In this manner, the light is not merely irradiated on the certain area AR of the substrate G but is irradiated on a local spot within the certain area AR at an arbitrary illuminance.

If the substrate G has an additional area required to be locally exposed (step S5 in FIG. 7), the light emitting operations of the UV-LED elements L is controlled with respect to the additional area. If there exists no additional area required to be locally exposed (step S5 in FIG. 7), the local exposure processing of the substrate G comes to an end. As can be seen in FIG. 3, the exposure processing (EXP) is additionally performed before or after the local exposure processing (AE). If the entire exposure processing on the substrate G including the exposure processing (EXP) and the local exposure processing (AE) is finished, the resist film thus exposed is subjected to the developing process by the developing apparatus 56 (DEP).

With the present embodiment described above, an arbitrary area to be subjected to film thickness reduction can locally exposed in addition to the typical exposure processing for the entire areas of the substrate G. In this local exposure processing, the film thickness can be reduced to a desired value by setting the exposure dose in advance. Therefore, even if the resist film is half-exposed to have different thickness portions (a thick portion and a thin portion) (namely, if the resist film has a reduced thickness as in the thin portion), it is possible to make uniform the thickness of the resist film obtained after the development processing. As a result, it becomes possible to suppress occurrence of irregularity in the line width of the wiring patterns and the pitch between the wiring patterns.

In addition, the maximum on-substrate illuminance of the UV-LED elements L used in the present disclosure is approximately one tenth of the on-substrate illuminance of the exposure apparatus 55 (EXP). Therefore, a desired distribution of cumulative exposure dose can be accurately obtained in the plane of the substrate G by controlling the lighting time of the UV-LED elements L, the electric current supplied to the UV-LED elements L, the conveying speed of the substrate G and the like. In proportion to a decrease in the on-substrate irradiation area illuminated by each of the UV-LED elements L, it is possible to increase the exposure resolution (to more finely perform exposure correction). In the present disclosure, the distribution of the resist film thickness on the substrate G is set equal to a desired value by reducing the residual resist film thickness. It is not possible to process the resist film to have a residual film thickness greater than the original one.

Figure 10:
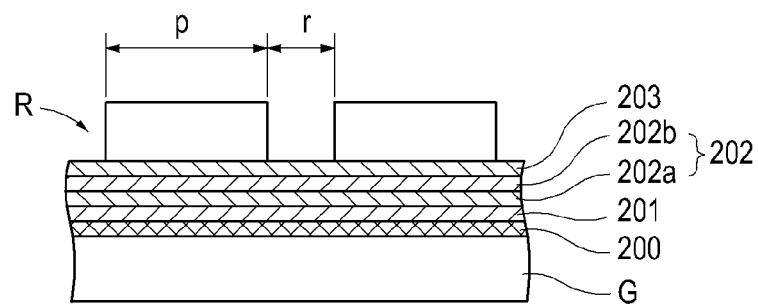
FIG. 10 is a section view showing a resist pattern formed on a substrate.

The present disclosure can find its application in the fields described below. In the conventional exposure processing performed by the exposure apparatus 55, an exposure mask having a reduced line width and a reduced inter-line gap is used in order to reduce the line width p and the inter-line gap r of the resist pattern R formed on the substrate G (see FIG. 10).

Figure 11A:
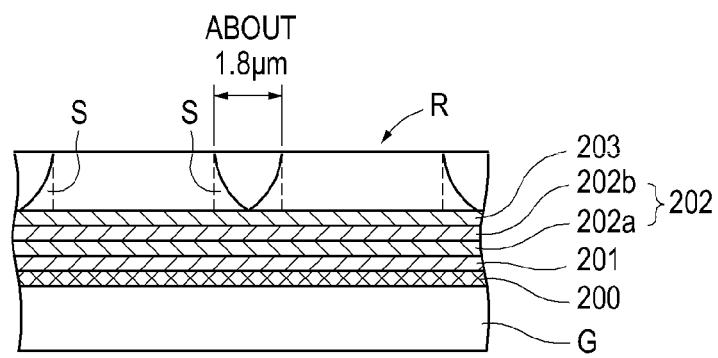
FIGS. 11A and 11B are views illustrating other applications of the present disclosure.
Figure 11B:
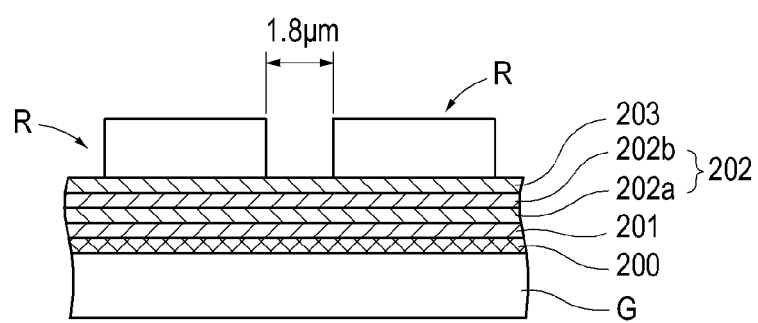

With the present disclosure, the line width p and the inter-line gap r of the resist pattern R can be made smaller than the conventional ones even using the conventional exposure mask. More specifically, when one wishes to form a resist pattern having an inter-line gap r of, e.g., 1.8 nm, exposure is performed by the exposure apparatus 55 at an exposure dose equivalent to about 50% of a typical exposure dose using an exposure mask for an inter-line gap r of 2.4 nm. In this case, the distribution of cumulative exposure dose in the thickness direction of the resist pattern R becomes a V-like shape as shown in FIG. 11A. If the development processing is performed in this state, there remains an unnecessary resist portion S in the resist pattern R. In the present disclosure, the light of the UV-LED elements L is irradiated on the resist pattern R prior to the development processing. In other words, exposure correction is carried out. If the development processing is performed subsequently, the unnecessary resist portion S is not left in the resist pattern R. Since the exposure apparatus 55 performs the exposure at an exposure dose equivalent to about 50% of a typical exposure dose, the exposure gap r of the resist pattern R becomes equal to about 1.8 μm. During the time period between the resist coating processing and the development processing, the substrate G is dried under a reduced pressure within a sealed process vessel or is subjected to heat treatment. Therefore, the areas of the resist pattern R outside the exposure gap are hardly dissolved during the development processing even if they are slightly exposed to the light. As shown in FIG. 11B, the inter-line gap r of the resist pattern R becomes equal to 1.8 μm at the end of the development processing. In this manner, the present disclosure makes it possible to reduce the line width p and the inter-line gap r of the resist pattern R using the exposure apparatus 55 even when the conventional exposure mask is used.

The tasks shown in FIG. 4 are performed prior to actually processing the substrate G in order to obtain reference data and to store the reference data in the local exposure apparatus 1. These tasks are performed once or more than once. If the tasks shown in FIG. 4 are finished, the substrates G to be actually processed are continuously conveyed through and processed by the local exposure apparatus 1. The operation of the local exposure apparatus 1 is controlled pursuant to the reference data.

Figure 12:
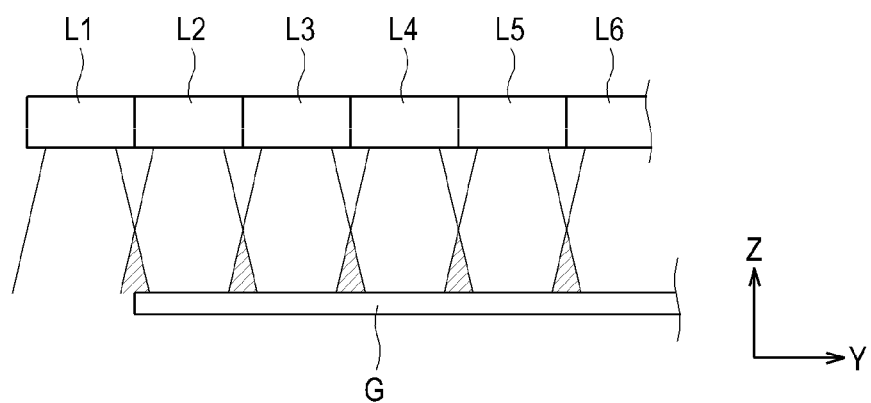
FIG. 12 is a view for explaining light interference between light-emitting elements adjacent to each other.
Figure 13:
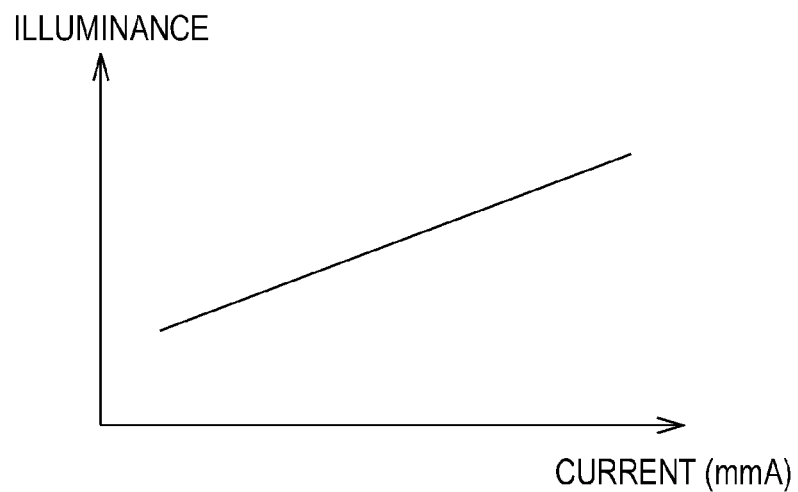
FIG. 13 is a graph representing the relationship between an electric current and an illuminance in the light-emitting elements.

Prior to performing the tasks shown in FIG. 4, the relationship between the electric current and the on-substrate illuminance for each of the UV-LED elements L1 through Ln needs to be measured and stored in the local exposure apparatus 1 in order to correct any error (or difference) in illuminance between the UV-LED elements L1 through Ln. The reason for performing the error correction is that the UV-LED elements L1 through Ln may show subtle variations in illuminance even if the same amount of current is fed to the UV-LED elements L1 through Ln. Referring to FIG. 12, the light of the UV-LED elements L is diffused by the light diffusing plate of the light irradiation window 6. The beams of lights of the mutually adjoining UV-LED elements L interfere with each other on the substrate G. This mutual interference is taken into account when measuring and storing the relationship between the electric current and the on-substrate illuminance for each of the UV-LED elements L1 through Ln. More specifically, when measuring the on-substrate illuminance of, e.g., the UV-LED element L2, consideration is given to the fact that the light of the UV-LED element L2 interferes with the light of the UV-LED elements L1 and L3. The on-substrate illuminance of an a region within the substrate G illuminated by the UV-LED element L2 is measured and stored with respect to the combinations of the electric currents of the UV-LED elements L1, L2 and L3 while independently changing the electric currents of the UV-LED elements L1, L2 and L3 from zero to the highest value. As an exemplary result of the measurement, the illumination with respect to a certain combination of the electric currents of the interfering UV-LED elements can be represented by a graph as shown in FIG. 13. Each of the UV-LED elements L1 through Ln has a characteristic as represented by the graph in FIG. 13. The light emitting operations of the UV-LED elements L1 through Ln are controlled pursuant to the results of measurement mentioned above.

Next, description will be made on a second embodiment. The same components as those of the first embodiment will not be described herein.

In the second embodiment, other data than the relationship between the electric current and the on-substrate illuminance for each of the UV-LED elements L1 through Ln, e.g., a) the kind of resist, b) the reduced-pressure achievement degree when performing the reduced-pressure drying in the reduced-pressure drying apparatus 52, c) the heat treatment temperature in the pre-bake apparatus 53 and d) the relationship between the values a), b) and c) and the in-plane distribution of the residual resist film thickness on the substrate G, are measured in advance and stored in the local exposure apparatus 1. At this time, it is preferred that the in-plane distribution of the residual resist film thickness is measured and stored in a corresponding relationship with each of the process conditions to be used when actually processing the substrate G. For example, the residual film thickness of the resist on the substrate G is measured and stored in a corresponding relationship with each of different combinations of the resist kind, the reduced-pressure achievement degree and the pre-bake temperature used in the actual processing. When actually processing the substrate G (hereinafter, referred to as "processing A"), after finishing the measurement tasks, the data on the residual resist film thickness corresponding to the processing A are selected and the UV-LED elements L1 through Ln are turned on pursuant to the data thus selected. When subjecting the substrate G to another processing (hereinafter, referred to as "processing B"), the data on the residual resist film thickness corresponding to the processing B are selected and the UV-LED elements L1 through Ln are controlled pursuant to the data thus selected. With this apparatus configuration, it is possible to select the conditions conforming to the individual processing and to immediately start the processing of the substrate G even when there exists a plurality of processing conditions as in the processing A and the processing B.

Among the arrangement examples of the local exposure apparatus 1 (AE) shown in FIGS. 3A through 3E, it is most preferable to use the arrangement example shown in FIG. 3D. The reason is as follows. The residual film thickness of the resist on the substrate G is subtly changed as time lapses from the exposure processing to the development processing. In view of this, it is desirable to keep substantially constant the time taken from the exposure processing to the development processing. To this end, it is presumably most preferable that the exposure apparatus 55, the local exposure apparatus 1 and the developing apparatus 56 be arranged in succession.

In FIG. 2, the Y-direction length of the UV-LED elements L1 through Ln is preferably set greater than the width of the substrate G by, e.g., about 10 to 40 mm. This makes it possible to accurately process the end portion of the substrate G.

Figure 14:
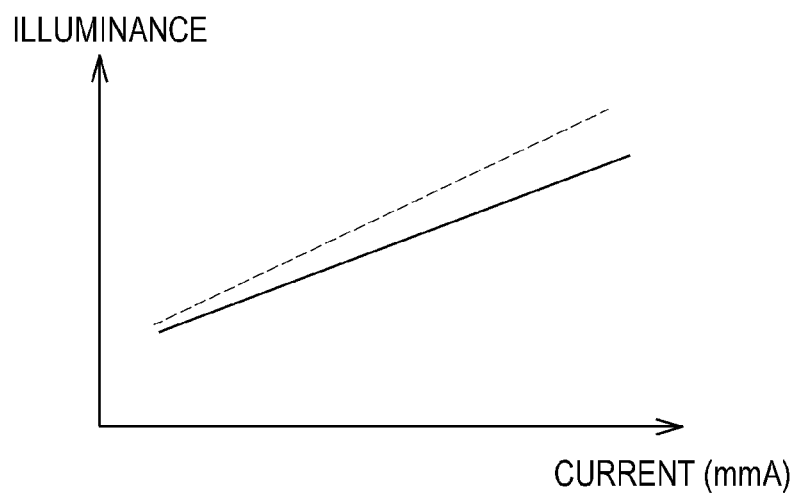
FIG. 14 is a graph representing the relationship between an electric current and an illuminance in the light-emitting elements put into use for a predetermined period of time.

The measurement tasks for each of the UV-LED elements L1 through Ln set forth above in respect of FIG. 4 may be carried out on a periodical basis. The UV-LED elements L1 through Ln are degraded over time if they are used in an on-state. For this reason, the relationship between the electric current and the illuminance is initially maintained like the graph shown in FIG. 13 but, after the UV-LED elements L1 through Ln are used for a specified time, the slope of the graph becomes less steep like the graph shown in FIG. 14. Accordingly, it is preferred that, after the UV-LED elements L1 through Ln are used for, e.g., 500 hours, in an on-state, the tasks shown in FIG. 4 be performed again to obtain new measurement results which are newly stored in place of the existing reference data. This makes it possible to increase the processing accuracy of the substrate G because the over-time degradation of the UV-LED elements L1 through Ln is taken into account.

The UV-LED elements L1 through Ln may be individually controlled one by one. Alternatively, a plurality of, e.g., four, adjoining UV-LED elements L1 through L4 may be controlled as a single set. The program for controlling the operations of the present local exposure apparatus 1 is stored in the control unit 40. Alternatively, the program may be stored in a separate storage medium and may be called out to control the operations of the present local exposure apparatus 1.

Next, description will be made on a third embodiment. The same components as those of the preceding embodiments will not be described herein.

Figure 15:
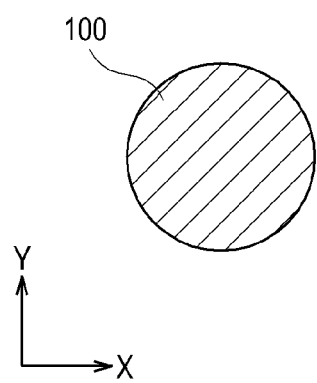
FIG. 15 is a view depicting parallel lights.
Figure 16:
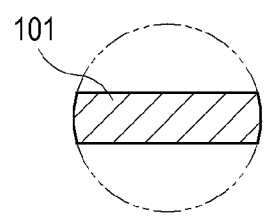
FIG. 16 is a view depicting light traveling through a cylindrical lens.

In the third embodiment, a cylindrical lens is used in place of the light diffusing plate of the light irradiation window 6. The cylindrical lens means a lens configured to receive parallel light as incoming light and collect outgoing light on a strip-shaped area. If parallel light 100 is received as incoming light as shown in FIG. 15, the outgoing light irradiated from the cylindrical lens is collected on a strip-shaped area 101 as illustrated in FIG. 16.

Figure 17:
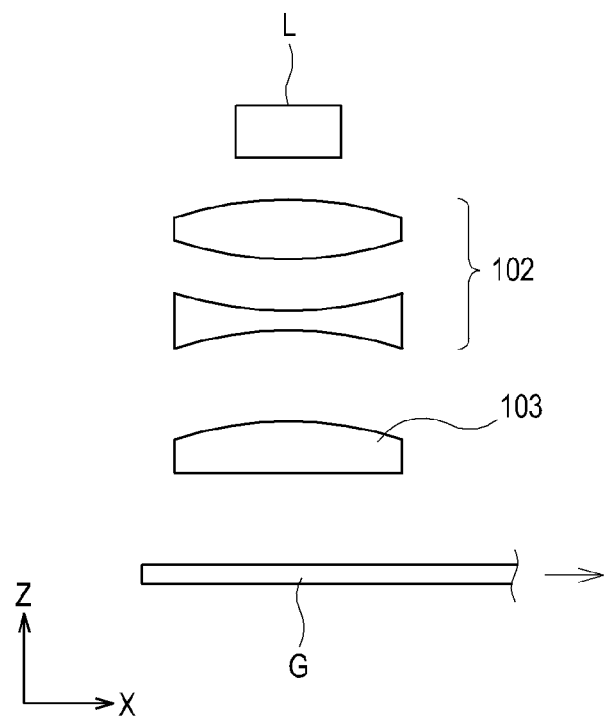
FIG. 17 is a plan view for explaining a local exposure apparatus according to a third embodiment of the present disclosure.
Figure 19A:
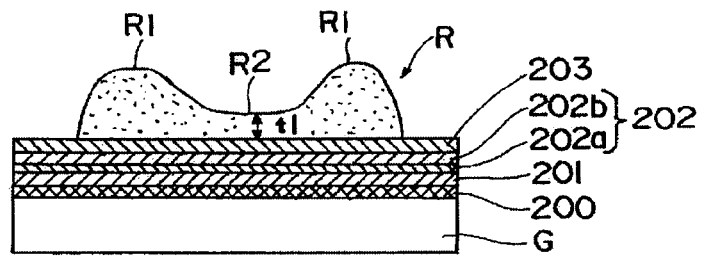
FIGS. 19A through 19E are section views for explaining a wiring pattern formation process that makes use of half exposure processing.
Figure 19B:
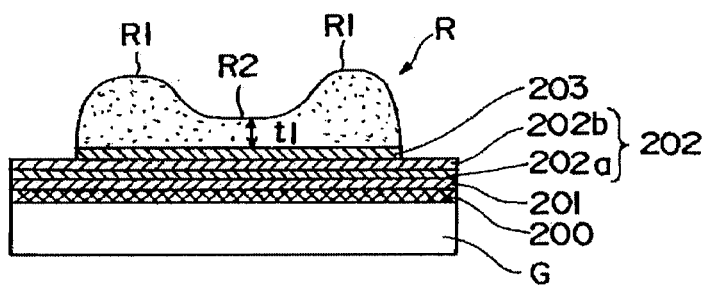
Figure 19C:
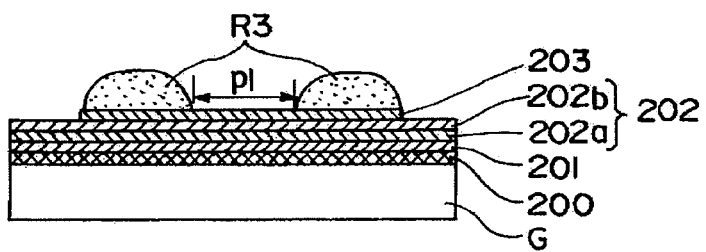
Figure 19D:
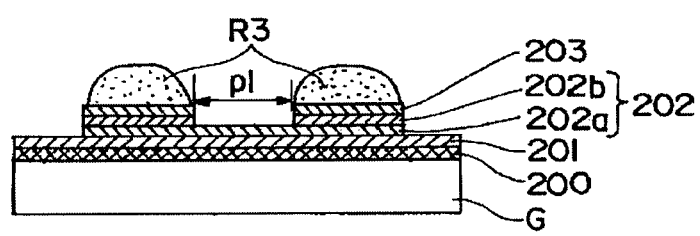
Figure 19E:
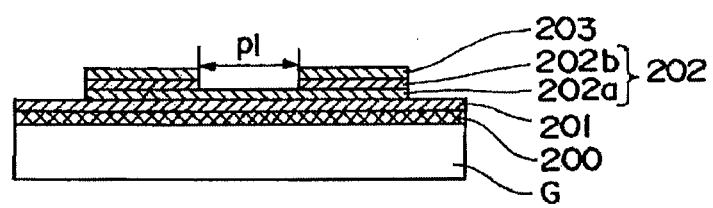
Figure 20A:
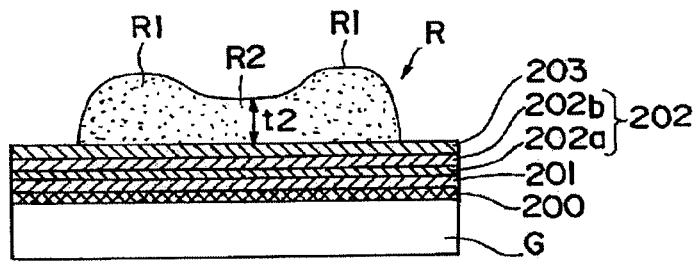
FIGS. 20A through 20E are section views illustrating a wiring pattern formation process that makes use of half exposure processing, in which views the thickness of a resist film is greater than that shown in FIGS. 19A through 19E.
Figure 20B:
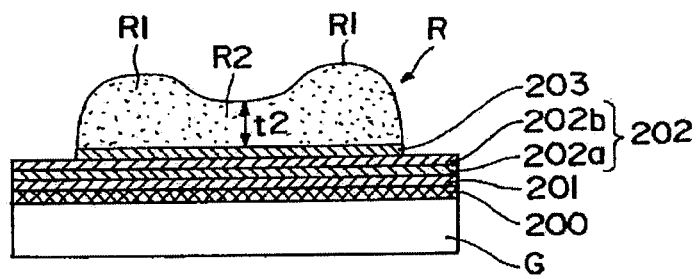
Figure 20C:
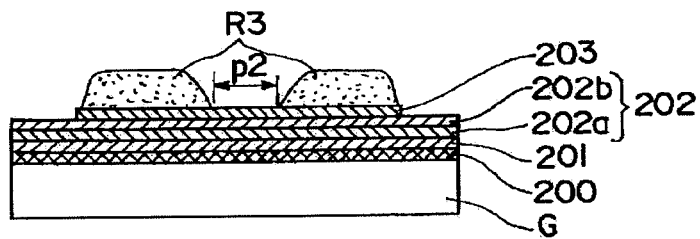
Figure 20D:
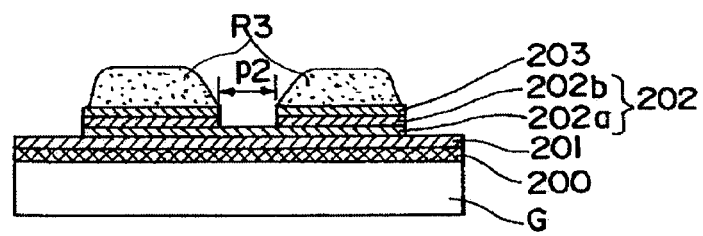
Figure 20E:
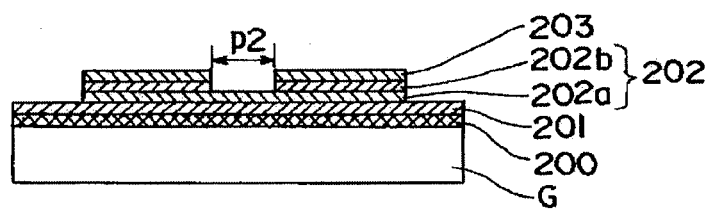

In the third embodiment, as shown in FIG. 17, a plurality of lenses 102 (serving as a parallel light generating units) is provided to convert the lights from the UV-LED elements L to parallel lights. Thus, the lights passing through the lenses 102 become parallel lights. A cylindrical lens 103 (serving as a light collecting means) is arranged between the lenses 102 and the light irradiation window 6. Accordingly, the light irradiated on the substrate G through the light irradiation window 6 is distributed within a strip-shaped area. The beams of lights emitted from the mutually adjoining UV-LED elements L do not interfere with each other (are not diffused to such a degree as to interfere with each other) prior to passing through the lenses 102. When measuring and storing the relationship between the electric current and the on-substrate illuminance for each of the UV-LED elements L1 through Ln, it is only necessary to measure and store the on-substrate illuminance of the UV-LED elements L1 through Ln one after another while changing the electric current from zero to the highest value. This is because the beams of light emitted from the mutually adjoining UV-LED elements L do not interfere with each other. With the third embodiment, it is therefore possible to simplify the measurement tasks and to enhance the reliability of the apparatus.

In the embodiment described above, the exposure processing is performed while horizontally conveying the substrate G However, the present disclosure is not limited to this embodiment. Alternatively, a target substrate may be held in a fixed state within a chamber to perform the exposure processing. In this case, the linear light source may be moved with respect to the target substrate (that is to say, the linear light source and the target substrate may be moved relatively to each other). As schematically shown in FIG. 18 depicting a fourth embodiment of the present disclosure (showing a disc-shaped semiconductor wafer Wa used as a target substrate), a bundle of UV-LED elements conforming to the shape of a target substrate may be provided to perform the light emitting operations of the UV-LED elements L corresponding to the area AR (or the shape) required to be locally exposed.

By the configuration of the apparatus and method of the present disclosure, in addition to an exposure process with respect to an entire region of a substrate, an arbitrary region of the substrate whose film thickness is necessary to be further reduced can be locally exposed. Further, such a local exposure process may reduce the film thickness to a desired film thickness with a preset exposure dose. Accordingly, for example, even in case that a resist has different thickness portions (namely, a thick portion and a thin portion) through a half exposure processing, i.e., even in case that there exists a portion having a thin thickness, it is possible to adjust the film thickness of the resist to be even after a development processing. Consequently, the line widths and pitches of a wiring pattern can be prevented from being irregular.

According to the present disclosure, it is possible to provide a local exposure apparatus and method, which is capable of enhancing the in-plane thickness uniformity of a residual resist film left after development processing and capable of reducing the irregularity in line width and pitch of a wiring pattern, and a storage medium for storing a program for execution of the local exposure method.

While certain embodiments have been described, these embodiments have been presented by way of example only, and are not intended to limit the scope of the disclosures. Indeed, the novel apparatuses, methods and storage medium described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A local exposure apparatus for performing exposure processing on a specific area of a photosensitive film formed on a metal layer of a substrate, the photosensitive film having a thick portion and a thin portion, the apparatus comprising:
a substrate conveying unit configured to form a substrate conveying path and to horizontally convey the substrate along the substrate conveying path at a specified substrate conveying speed;
a chamber configured to surround a part of the substrate conveying path and to form an exposure processing space in which the substrate is subjected to the exposure processing;
a light source including a plurality of light-emitting elements linearly arranged in a direction intersecting a substrate conveying direction above the substrate conveying path within the chamber, the light source being capable of illuminating the photosensitive film on the substrate conveyed below the light source with lights emitted from the plurality of light-emitting elements;
a light emission drive unit configured to selectively drive one or more of the plurality of light-emitting elements of the light source as a single light emission control unit;
a substrate detecting unit arranged at an upstream side of the light source in the substrate conveying path and configured to detect the substrate conveyed by the substrate conveying unit; and
a control unit configured to receive a substrate detection signal from the substrate detecting unit and to control the light emission drive unit to drive the plurality of light-emitting elements,
wherein the control unit is configured to find a conveying position of the substrate based on the substrate detection signal from the substrate detecting unit and the substrate conveying speed and control the light emission drive unit such that, when the thin portion of the photosensitive film formed on the metal layer of the substrate moves below the light source, one or more of the plurality of light-emitting elements capable of illuminating the thin portion having a film thickness being thicker than a predetermined film thickness are driven to emit the lights thereby reducing the film thickness of the thin portion based on reference data having two-dimensional coordinate values and a film thickness reduction value corresponding to the thin portion having the film thickness being thicker than the predetermined film thickness,
wherein the local exposure apparatus is arranged before or after an exposure processing apparatus, the exposure processing apparatus configured to perform further exposure process, and
wherein the reference data is obtained by measuring a residual resist film thickness, a line width of wiring patterns and a pitch between the wiring patterns in a plane of each of sampling substrates exposure-processed by the exposure processing apparatus.

2. The apparatus of claim 1, wherein the light emission drive unit drives the plurality of light-emitting elements of the light source to respectively emit the lights with changeable illuminances, and
wherein said one or more of the plurality of light-emitting elements capable of illuminating the thin portion having the film thickness being thicker than the predetermined film thickness are respectively driven to emit the lights based on predetermined illuminances.

3. The apparatus of claim 1, further comprising:
a light diffusing plate provided below the light source, the lights emitted from the light source being irradiated on the substrate through the light diffusing plate.

4. The apparatus of claim 1, further comprising:
a parallel light generating unit arranged below the light source and configured to convert the lights of the plurality of light-emitting elements to parallel lights; and
a light collecting unit configured to collect the parallel lights having passed through the parallel light generating unit toward a strip-shaped area,
wherein the lights emitted from the light source are irradiated on the substrate through the parallel light generating unit and the light collecting unit.

5. A local exposure apparatus for performing exposure processing on a specific area of a photosensitive film formed on a metal layer of a substrate, the photosensitive film having a thick portion and a thin portion, the apparatus comprising:
a chamber configured to accommodate the substrate and to form an exposure processing space in which the substrate is subjected to the exposure processing;
a substrate holding unit configured to hold the substrate within the chamber;
a light source including a plurality of light-emitting elements linearly arranged above the substrate holding unit within the chamber, the light source being capable of illuminating the photosensitive film on the substrate held by the substrate holding unit with lights emitted from the plurality of light-emitting elements;
a light emission drive unit configured to selectively drive one or more of the plurality of light-emitting elements of the light source as a single light emission control unit;
a moving unit configured to parallel-move the plurality of light-emitting elements and the substrate relatively to each other; and
a control unit configured to control the light emission drive unit to drive the plurality of light-emitting elements,
wherein the control unit is configured to control the light emission drive unit such that, when the thin portion of the photosensitive film formed on the metal layer of the substrate moves below the light source, one or more of the plurality of light-emitting elements capable of illuminating the thin portion having a film thickness being thicker than a predetermined film thickness are driven to emit the lights thereby reducing the film thickness of the thin portion based on reference data having two-dimensional coordinate values and a film thickness reduction value corresponding to the thin portion having the film thickness being thicker than the predetermined film thickness, wherein the local exposure apparatus is arranged after or before an exposure processing apparatus, the exposure processing apparatus configured to perform further exposure process, and wherein the reference data is obtained by measuring a residual resist film thickness, a line width of wiring patterns and a pitch between the wiring patterns in a plane of each of sampling substrates exposure-processed by the exposure processing apparatus.

6. The apparatus of claim 5, wherein the light emission drive unit drives the plurality of light-emitting elements of the light source to respectively emit the lights with changeable illuminances, and wherein said one or more of the plurality of light-emitting elements capable of illuminating the thin portion having the film thickness being thicker than the predetermined film thickness are respectively driven to emit the lights based on predetermined illuminances.

7. The apparatus of claim 5, further comprising:
a light diffusing plate provided below the light source, the lights emitted from the light source being irradiated on the substrate through the light diffusing plate.

8. The apparatus of claim 5, further comprising:
a parallel light generating unit arranged below the light source and configured to convert the lights of the plurality of light-emitting elements to parallel lights; and
a light collecting unit configured to collect the parallel lights having passed through the parallel light generating unit toward a strip-shaped area,
wherein the lights emitted from the light source are irradiated on the substrate through the parallel light generating unit and the light collecting unit.

9. A local exposure method, which is performed before or after a further exposure process performed on a substrate, for locally exposing a specific area of a photosensitive film formed on a metal layer of the substrate conveyed along a substrate conveying path by selectively controlling a plurality of light-emitting elements to emit lights within a chamber configured to cover a part of the substrate conveying path and to form an exposure processing space for the substrate, the plurality of light-emitting elements being linearly arranged in a direction intersecting a conveying direction of the substrate above the substrate conveying path, the photosensitive film having a thick portion and a thin portion, the method, comprising:

horizontally conveying the substrate along the substrate conveying path;

detecting the substrate conveyed along the substrate conveying path; and when the thin portion of the photosensitive film formed on the metal layer of the substrate moves below the plurality of light-emitting elements, controlling one or more of the plurality of light-emitting elements capable of illuminating the thin portion having a film thickness being thicker than a predetermined film thickness to emit the lights thereby reducing the film thickness of the thin portion based on reference data having two-dimensional coordinate values and a film thickness reduction value corresponding to the thin portion having the film thickness being thicker than the predetermined film thickness, wherein the reference data is obtained by measuring a residual resist film thickness, a line width of wiring patterns and a pitch between the wiring patterns in a plane of each of sampling substrates exposure-processed by the further exposure process.

10. The method of claim 9, wherein the plurality of light-emitting elements are configured to respectively emit the lights with changeable illuminances, and wherein said one or more of the plurality of light-emitting elements capable of illuminating the thin portion having the film thickness being thicker than the predetermined film thickness are respectively controlled to emit the lights based on predetermined illuminances.

11. The method of claim 9, wherein the lights emitted from the plurality of light-emitting elements are irradiated on the substrate through a light diffusing plate.

12. The method of claim 11, wherein the plurality of light-emitting elements are configured to respectively emit the lights with changeable illuminances and controlled to emit the lights based on on-substrate illuminances of the lights irradiated through the light diffusing plate.

13. The method of claim 9, wherein the lights emitted from the plurality of light-emitting elements are irradiated on the substrate through a parallel light generating unit configured to convert the lights of the plurality of light-emitting elements to parallel lights and a light collecting unit configured to collect the parallel light having passed through the parallel light generating unit on a strip-shaped area.

14. A local exposure method, which is performed before or after a further exposure process performed on a substrate, for locally exposing a specific area of a photosensitive film formed on a metal layer of the substrate by selectively controlling a plurality of light-emitting elements to emit lights on a target surface of the substrate within a chamber forming an exposure processing space for the substrate, the photosensitive film having a thick portion and a thin portion, the method comprising:

holding the substrate within the chamber; and controlling one or more of the plurality of light-emitting elements capable of illuminating the thin portion having a film thickness being thicker than a predetermined film thickness to emit the lights thereby reducing the film thickness of the thin portion based on reference data having two-dimensional coordinate values and a film thickness reduction value corresponding to the thin portion having the film thickness being thicker than the predetermined film thickness while parallel-moving the light-emitting elements and the held substrate relative to each other, wherein the reference data is obtained by measuring a residual resist film thickness, a line width of wiring patterns and a pitch between the wiring patterns in a plane of each of sampling substrates exposure-processed by the further exposure process.

15. The method of claim 14, wherein the plurality of light-emitting elements are configured to respectively emit the lights with changeable illuminances, and wherein said one or more of the plurality of light-emitting elements capable of illuminating the thin portion having the film thickness being thicker than the predetermined film thickness are respectively controlled to emit the lights based on predetermined illuminances.

16. The method of claim 14, wherein the lights emitted from the plurality of light-emitting elements are irradiated on the substrate through a light diffusing plate.

17. The method of claim 16, wherein the plurality of light-emitting elements are configured to respectively emit the lights with changeable illuminances and controlled to emit the lights based on on-substrate illuminances of the lights irradiated through the light diffusing plate.

18. The method of claim 14 wherein the lights emitted from the plurality of light-emitting elements are irradiated on the substrate through a parallel light generating unit configured to convert the lights of the light-emitting elements to parallel lights and a light collecting unit configured to collect the parallel lights having passed through the parallel light generating unit on a strip-shaped area.

19. A non-transitory storage medium storing a program, which is performed before or after a further exposure process performed on a substrate, for locally exposing a specific area of a photosensitive film formed on a metal layer of the substrate by controlling at least a part of a plurality of light-emitting elements to emit lights, the photosensitive film having a thick portion and a thin portion, the program sequentially performing:
  preparing in advance data needed to correct individual illuminance variations of the light-emitting elements and reference data having two-dimensional coordinate values and a film thickness reduction value corresponding to the thin portion having a film thickness being thicker than a predetermined film thickness;
  positioning the substrate in an exposure processing space; and
  based on the data and the reference data, controlling one or more of the plurality of light-emitting elements capable of illuminating the thin portion having the film thickness being thicker than the predetermined film thickness to emit the lights thereby reducing the film thickness of the thin portion while parallel-moving the substrate positioned in the exposure processing space and the light-emitting elements relative to each other,
  wherein the reference data is obtained by measuring a residual resist film thickness, a line width of wiring patterns and a pitch between the wiring patterns in a plane of each of sampling substrates exposure-processed by the further exposure process.

20. A local exposure method, which is performed before or after a further exposure process performed on a substrate, for locally exposing a specific area of a resist film formed on a metal layer of the substrate conveyed along a substrate conveying path by selectively controlling a plurality of light-emitting elements to emit lights within a chamber configured to cover a part of the substrate conveying path and to form an exposure processing space for the substrate, the plurality of light-emitting elements being linearly arranged in a direction intersecting a substrate conveying direction above the substrate conveying path, the resist film having a thick portion and a thin portion, the method comprising:
  coating a resist on a surface of the substrate;
  drying the resist coated on the substrate;
  exposing the substrate coated with the resist through a photomask corresponding to a circuit pattern by an exposure dose smaller than a exposure dose required to form the circuit pattern;
  selectively controlling the plurality of light-emitting elements capable of illuminating the thin portion having a film thickness being thicker than a predetermined film thickness to emit the lights thereby reducing the film thickness of the thin portion to expose the substrate coated with the resist based on reference data having two-dimensional coordinate values and a film thickness reduction value corresponding to the thin portion having the film thickness being thicker than the predetermined film thickness; and
  developing the exposed substrate,
  wherein the reference data is obtained by measuring a residual resist film thickness, a line width of wiring patterns and a pitch between the wiring patterns in a plane of each of sampling substrates exposure-processed by the further exposure process.

* * * * *